US008940559B2

(12) United States Patent
Kearl et al.

(10) Patent No.: US 8,940,559 B2

(45) Date of Patent: Jan. 27, 2015

(54) METHOD OF FABRICATING AN INTEGRATED ORIFICE PLATE AND CAP STRUCTURE

(75) Inventors: Daniel A Kearl, Philomath, OR (US); Rio Rivas, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 513 days.

(21) Appl. No.: 13/289,208

(22) Filed: Nov. 4, 2011

(65) Prior Publication Data

US 2013/0115724 A1 May 9, 2013

(51) Int. Cl.
*H01L 21/00* (2006.01)
*B41J 2/16* (2006.01)

(52) U.S. Cl.
CPC .............. *B41J 2/1603* (2013.01); *B41J 2/1628* (2013.01); *B41J 2/1629* (2013.01); *B41J 2/1631* (2013.01); *B41J 2/1642* (2013.01); *B41J 2/1643* (2013.01); *B41J 2/1645* (2013.01)
USPC .................. 438/21; 438/703; 216/27; 347/47

(58) Field of Classification Search
CPC .... B41J 2/14233; B41J 2/1623; B41J 2/1628; B41J 2/1626; B41J 2/1433; B41J 2/1631; H01L 21/6835; H01L 21/76898; H01L 41/0973
USPC ................... 438/21, 455, 459, 689, 692, 703; 347/44, 45, 46, 47, 68
See application file for complete search history.

(56) References Cited

U.S. PATENT DOCUMENTS

| | | | | |
|---|---|---|---|---|
| 6,136,646 | A * | 10/2000 | Linliu et al. | 438/255 |
| 6,450,623 | B1 | 9/2002 | Watanabe et al. | |
| 6,604,817 | B2 | 8/2003 | Isono et al. | |
| 7,591,541 | B2 | 9/2009 | Silverbrook | |
| 7,603,756 | B2 | 10/2009 | Lim et al. | |
| 7,851,978 | B2 | 12/2010 | Bayer et al. | |
| 2003/0142170 | A1* | 7/2003 | Haluzak et al. | 347/54 |
| 2007/0059939 | A1* | 3/2007 | Chapman | 438/719 |
| 2010/0165048 | A1* | 7/2010 | DeBrabander et al. | 347/47 |

FOREIGN PATENT DOCUMENTS

JP 2010214795 9/2010

* cited by examiner

*Primary Examiner* — Khiem D Nguyen

(74) *Attorney, Agent, or Firm* — Hewlett-Packard Patent Department; Nathan Rieth

(57) ABSTRACT

In an embodiment, a method of fabricating an integrated orifice plate and cap structure includes forming an orifice bore on the front side of a product wafer, coating side walls of the orifice bore with a protective material, grinding the product wafer from its back side to a final thickness, forming a first hardmask for subsequent cavity formation, forming a second hardmask over the first hardmask for subsequent descender formation, forming a softmask over the second hardmask for subsequent convergent bore formation, etching a latent convergent bore using the softmask as an etch delineation feature, etching a descender using the second hardmask as an etch delineation feature, and anisotropic etching of convergent bore walls and cavities using the first hardmask as an etch delineation feature.

20 Claims, 13 Drawing Sheets

METHOD OF FABRICATING AN INTEGRATED ORIFICE PLATE AND CAP STRUCTURE

BACKGROUND

A wide variety of materials and fabrication options exist for the production of inkjet orifice structures. These options include electroformed metallic part, laser-ablated polymeric films, direct-imaged photopolymer films, precision machined (i.e. micro-Electrical Discharged Machining) metallic foils, and silicon wafer-based processes. As print quality demands increase, however, there is a nearly continuous drive toward smaller drop weights and higher nozzle counts for competitive print systems. The resulting manufacturing challenges for orifice size, shape, and alignment are significant.

BRIEF DESCRIPTION OF THE DRAWINGS

The present embodiments will now be described, by way of example, with reference to the accompanying drawings, in which.

DETAILED DESCRIPTION

Overview

Figure 1:
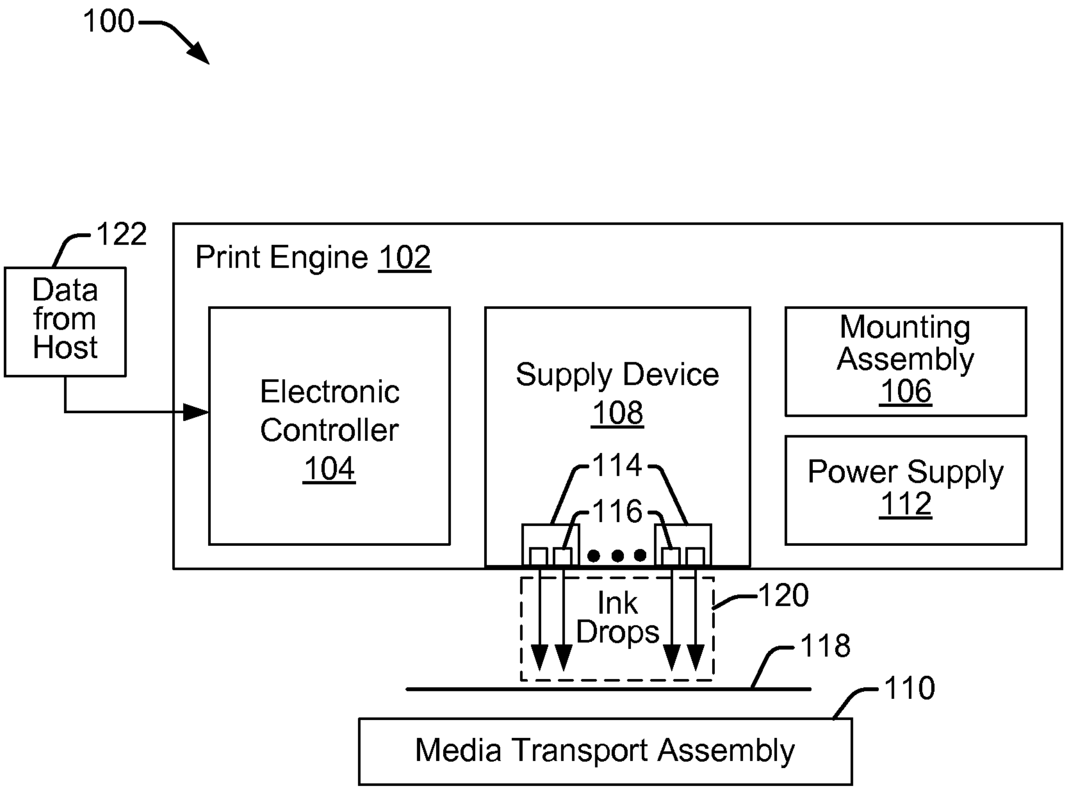
FIG. 1 shows an inkjet printing system suitable for implementing a fluid ejection device having an integrated orifice plate and cap structure as disclosed herein, according to an embodiment.

State-of-the art piezoelectric ink jet (PIJ) devices utilize a combination of thin film PZT (Lead Zirconate Titanate) actuators and elaborate micro-fluidic components that are fabricated using a mixture of integrated circuit and MEMS techniques. These thin film PZT actuators are placed in a substantially hermetic environment within a protective cavity to prevent device degradation from ink and moisture. Various geometries have been used for the actuators themselves, as well as the micro fluidic conduits that route ink from the supply reservoirs, into the active firing chambers, and subsequently out of the device as an ejected stream of droplets.

As noted above, manufacturing challenges for orifice size, shape, and alignment in inkjet orifice structures are significant. Inkjet devices have utilized many different orifice fabrication techniques, including electroforming, laser-ablation, precision machining, direct imaging of photopolymers, and various silicon-based MEMS processes. The silicon orifice structures have been fabricated with anisotropic dry and/or wet etches. However, these techniques are typically applied toward the creation of a discrete orifice layer, and have not been used for the concurrent fabrication of both an orifice layer and an integral protective "cap" or cavity structure.

Embodiments of the present disclosure provide a design geometry and MEMS processing steps for the fabrication of a dual-purpose, integrated silicon orifice plate and protective cap structure, that provides both a protective cavity for the PZT actuators and the fluidic conduits that lead up to and form the actual droplet ejection orifices. The integration of these functions into one structure offers both performance and cost advantages in the manufacturing environment.

The described embodiments provide various benefits such as material robustness enabling a wide variety of ink chemistries and printhead servicing options, a well controlled bore diameter and straight-wall exit bore section, a convergent bore geometry favorable when using high viscosity inks, orifice bore alignment/concentricity control (i.e., descender-to-entrance, entrance-to-exit), the facilitation of surface energy control ("non-wetting" coatings) measures, integration into existing prototype/manufacturing processing schemes including high performance photolithography tools for critical alignment operations, and so on. These orifice-centric attributes are combined with the integration of what typically is a two or more piece assembly (orifice plate plus actuator protection enclosure) into a single micro-fabricated structure. The resulting structure can then be produced in a controlled, capital-efficient, and cost-effective manner with existing MEMS tooling.

In one example embodiment, a method of fabricating an integrated orifice plate and cap structure includes forming an orifice bore on the front side of a product wafer, coating side walls of the orifice bore with a protective material, grinding the product wafer from its back side to a final thickness, forming a first hardmask for subsequent cavity formation, forming a second hardmask over the first hardmask for subsequent descender formation, forming a softmask over the second hardmask for subsequent convergent bore formation, etching a latent convergent bore using the softmask as an etch stop, etching a descender using the second hardmask as an etch stop, and etching cavities using the first hardmask as an etch stop.

Illustrative Embodiments

FIG. 1 shows an inkjet printing system 100 suitable for implementing a fluid ejection device having an integrated orifice plate and cap structure as disclosed herein, according to an embodiment of the disclosure. In one embodiment, the inkjet printing system 100 includes a print engine 102 having a controller 104, a mounting assembly 106, one or more replaceable supply devices 108 (e.g., ink cartridges), a media transport assembly 110, and at least one power supply 112 that provides power to the various electrical components of inkjet printing system 100. The inkjet printing system 100 further includes one or more printheads 114 (fluid ejection devices) that eject droplets of ink or other fluid through a plurality of nozzles 116 (also referred to as orifices or bores) toward print media 118 so as to print onto the media 118. In some embodiments a printhead 114 may be an integral part of an ink cartridge supply device 108, while in other embodiments a printhead 114 may be mounted on a print bar (not shown) of mounting assembly 106 and coupled to a supply device 108 (e.g., via a tube). Print media 118 can be any type of suitable sheet or roll material, such as paper, card stock, transparencies, Mylar, polyester, plywood, foam board, fabric, canvas, and the like.

In the present embodiment, printhead 114 is a piezoelectric inkjet printhead that generates pressure pulses with a piezoelectric material actuator to force ink droplets out of a nozzle 116. Nozzles 116 are typically arranged in one or more columns or arrays along printhead 114 such that properly sequenced ejection of ink from nozzles 116 causes characters, symbols, and/or other graphics or images to be printed on print media 118 as printhead 114 and print media 118 are moved relative to each other.

Mounting assembly 106 positions printhead 114 relative to media transport assembly 110, and media transport assembly 110 positions print media 118 relative to printhead 114. Thus, a print zone 120 is defined adjacent to nozzles 116 in an area between printhead 114 and print media 118. In one embodiment, print engine 102 is a scanning type print engine. As such, mounting assembly 106 includes a carriage for moving printhead 114 relative to media transport assembly 110 to scan print media 118. In another embodiment, print engine 102 is a non-scanning type print engine. As such, mounting assembly 106 fixes printhead 114 at a prescribed position relative to media transport assembly 110 while media transport assembly 110 positions print media 118 relative to printhead 114.

Electronic controller 104 typically includes components of a standard computing system such as a processor, memory, firmware, and other printer electronics for communicating with and controlling supply device 108, printhead 114, mounting assembly 106, and media transport assembly 110. Electronic controller 104 receives data 122 from a host system, such as a computer, and temporarily stores the data 122 in a memory. Data 122 represents, for example, a document and/or file to be printed. As such, data 122 forms a print job for inkjet printing system 100 that includes one or more print job commands and/or command parameters. Using data 122, electronic controller 104 controls printhead 114 to eject ink drops from nozzles 116 in a defined pattern that forms characters, symbols, and/or other graphics or images on print medium 118.

Figure 2:
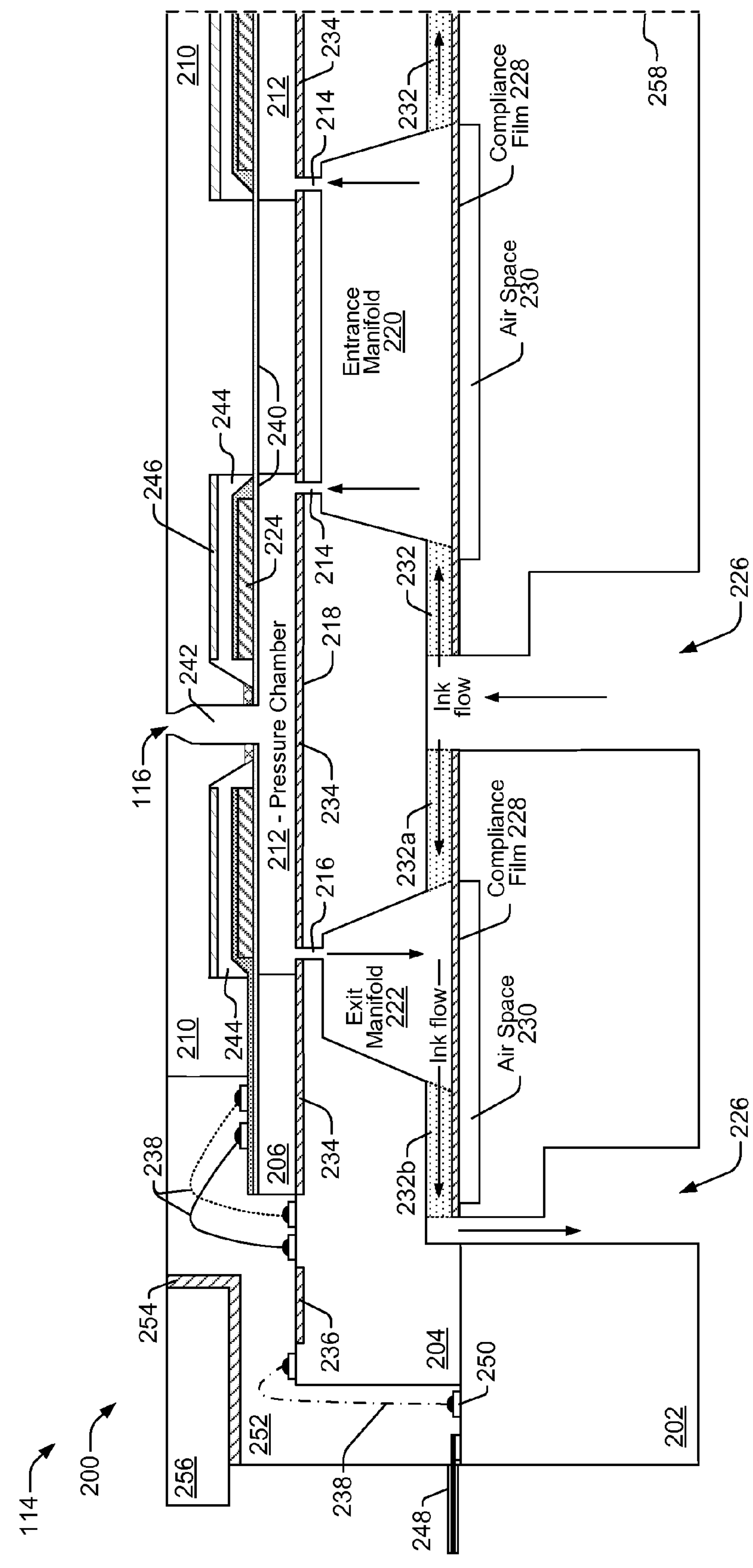
FIG. 2 shows a partial cross-sectional side view of a piezoelectric ink jet (PIJ) printhead having a piezoelectric die stack that includes an integrated orifice/nozzle plate and cap structure as disclosed herein, according to an embodiment.

FIG. 2 shows a partial cross-sectional side view of a PIJ printhead 114 having a piezoelectric die stack 200 that includes an integrated orifice/nozzle plate and cap structure as disclosed herein, according to an embodiment of the disclosure. While the integrated orifice plate and cap structure is described within the context of a particular PIJ printhead 114, there is no intent to limit its implementation to any particular PIJ printhead. In general, PIJ printhead 114 includes multiple die layers, each with different functionality and each being narrower than the die below (i.e., referencing die 202 of FIG. 2 as the bottom die).

The layers in the die stack 200 may include a first (i.e., bottom) substrate die 202, a second circuit die 204 (or ASIC die), a third actuator/chamber die 206, and a fourth integrated orifice plate and cap die/structure 210. In some more general PIJ die stack schemes, a circuit die may not be part of the die stack, but instead may be located near the die stack and coupled to the die stack through wire bond connections. As noted above, the integration of the protective cap and orifice/nozzle plate into a single structure offers improved performance and cost advantages in the manufacturing environment. Although not shown, there is also typically a non-wetting layer on top of the integrated structure 210 that includes a hydrophobic coating to help prevent ink puddling around nozzles 116. Each layer in the die stack 200 is typically formed of silicon, with the addition of an assortment of patterned thin films, except for the non-wetting layer. The layers are bonded together with a chemically inert adhesive such as epoxy (not shown). In the illustrated embodiment, the die layers have fluid passageways such as slots, channels, or holes for conducting ink to and from pressure chambers 212. Each pressure chamber 212 may include two ports (inlet port 214, outlet port 216) located in the floor 218 of the chamber (i.e., opposite the nozzle-side of the chamber) that are in fluid communication with an ink distribution manifold (entrance manifold 220, exit manifold 222). The floor 218 of the pressure chamber 212 is formed by the surface of the circuit layer 204. The two ports (214, 216) are on opposite sides of the floor 218 of the chamber 212 where they pierce the circuit layer 204 die and enable ink to be circulated through the chamber. The piezoelectric actuators 224 are on a flexible membrane 240 that serves as a roof to the chamber and is located opposite the chamber floor 218. Thus, the piezoelectric actuators 224 are located on the same side of the chamber 212 as are the nozzles 116 (i.e., on the roof or top-side of the chamber).

The bottom substrate die 202 comprises silicon and includes fluidic passageways 226 through which ink is able to flow to and from pressure chambers 212 via the ink distribution manifold (entrance manifold 220, exit manifold 222). Substrate die 202 supports a thin compliance film 228 with an air space 230 configured to alleviate pressure surges from pulsing ink flows through the ink distribution manifold due to start-up transients and ink ejections in adjacent nozzles, for example.

Circuit die 204 is the second die in die stack 200 and is located above the substrate die 202. In this implementation, circuit die 204 is adhered to substrate die 202 and is narrower than the substrate die 202. In some embodiments, the circuit die 204 may also be shorter in length than the substrate die 202. Circuit die 204 includes the ink distribution manifold that comprises ink entrance manifold 220 and ink exit manifold 222. Entrance manifold 220 provides ink flow into chamber 212 via inlet port 214, while outlet port 216 allows ink to exit the chamber 212 into exit manifold 222. Circuit die 204 also includes fluid bypass channels 232 that permit some ink coming into entrance manifold 220 to bypass the pressure chamber 212 and flow directly into the exit manifold 222 through the bypass 232. Bypass channel 232 creates an appropriately sized flow restrictor that narrows the channel so that desired ink flows are achieved within pressure chambers 212 and so sufficient pressure differentials between chamber inlet ports 214 and outlet ports 216 are maintained.

Circuit die 204 also includes CMOS electrical circuitry 234 implemented in an ASIC 234 and fabricated on its upper surface adjacent the actuator/chamber die 206. ASIC 234 includes ejection control circuitry that controls the pressure pulsing (i.e., firing) of piezoelectric actuators 224. At least a portion of ASIC 234 is located directly on the floor 218 of the pressure chamber 212. Because ASIC 234 is fabricated on the chamber floor 218, it can come in direct contact with ink inside pressure chamber 212. However, ASIC 234 is buried under a thin-film passivation layer (not shown) that includes a dielectric material to provide insulation and protection from the ink in chamber 212. Included in the circuitry of ASIC 234 are one or more temperature sensing resistors (TSR) and heater elements, such as electrical resistance films. The TSR's and heaters in ASIC 234 are configured to maintain the temperature of the ink in the chamber 212 at a desired and uniform level that is favorable to ejection of ink drops through nozzles 116.

Circuit die 204 also includes piezoelectric actuator drive circuitry/transistors 236 (e.g., FETs) fabricated on the edge of the die 204 outside of bond wires 238 (discussed below). Thus, drive transistors 236 are on the same circuit die 204 as the ASIC 234 control circuits and are part of the ASIC 234. Drive transistors 236 are controlled (i.e., turned on and off) by control circuitry in ASIC 234. The performance of pressure chamber 212 and actuators 224 is sensitive to changes in temperature, and having the drive transistors 236 out on the edge of circuit die 204 keeps heat generated by the transistors 236 away from the chamber 212 and the actuators 224.

The next layer in die stack 200 located above the circuit die 204 is the actuator/chamber die 206 ("actuator die 206", hereinafter). The actuator die 206 is adhered to circuit die 204 and it is narrower than the circuit die 204. In some embodiments, the actuator die 206 may also be shorter in length than the circuit die 204. Actuator die 206 includes pressure chambers 212 having chamber floors 218 that comprise the adjacent circuit die 204. As noted above, the chamber floor 218 additionally comprises control circuitry such as ASIC 234 fabricated on circuit die 204 which forms the chamber floor 218. Actuator die 206 additionally includes a thin-film, flexible membrane 240 such as silicon dioxide, located opposite the chamber floor 218 that serves as the roof of the chamber. Above and adhered to the flexible membrane 240 is piezoelectric actuator 224. Piezoelectric actuator 224 comprises a stack of thin-film piezoelectric, conductor, and dielectric materials that stresses mechanically in response to an applied electrical voltage. When activated, piezoelectric actuator 224 physically expands or contracts which causes the laminate of piezoceramic and membrane 240 to flex. This flexing displaces ink in the chamber, generating pressure waves in the pressure chamber 212 that ejects ink drops through the nozzle 116. In the embodiment shown in FIG. 2, both the flexible membrane 240 and the piezoelectric actuator 224 are split by a descender 242 that extends between the pressure chamber 212 and nozzle 116. Thus, piezoelectric actuator 224 is a split piezoelectric actuator 224 having a segment on each side of the chamber 212.

The integrated orifice plate and cap structure 210 is adhered above the actuator die 206. The integrated structure 210 may be narrower than the actuator die 206, and in some embodiments it may also be shorter in length than the actuator die 206. The integrated structure 210 forms a cap cavity 244 over piezoelectric actuator 224 that encloses the actuator 224. The cavity 244 is a sealed cavity that protects the actuator 224. Although the cavity 244 is not vented, the sealed space it provides is configured with sufficient open volume and clearance to permit the piezoactuator 224 to flex without influencing the motion of the actuator 224. The cap cavity 244 may have a ribbed upper surface 246 opposite the actuator 224 that increases the volume of the cavity and surface area (for increased adsorption of water and other molecules deleterious to the thin film pzt long term performance). The ribbed surface 246 is designed to strengthen the upper surface of the cap cavity 244 so that it can better resist damage from handling and servicing of the printhead (e.g., wiping). The ribbing helps reduce the thickness of the integrated orifice plate and cap structure 210 and shorten the length of the descender 242.

The integrated orifice plate and cap structure 210 also includes the descender 242. The descender 242 is a channel in the integrated structure 210 that extends between the pressure chamber 212 and nozzle 116 (also referred to as orifice or bore), enabling ink to travel from the chamber 212 and out of the nozzle 116 during ejection events caused by pressure waves from actuator 224. As noted above, in the FIG. 2 embodiment, the descender 242 and nozzle 116 are centrally located in the chamber 212, which splits the piezoelectric actuator 224 and flexible membrane 240 between two sides of the chamber 212. Nozzles 116 are formed in the integrated structure 210.

FIG. 2 shows only a partial (i.e., left side) cross-sectional view of die stack 200 in a PIJ printhead 114. However, the die stack 200 continues on toward the right side, past the dashed line 258 shown in FIG. 2. In addition, the die stack 200 is symmetrical, and it therefore includes features on its right side (not shown in FIG. 2) that mirror the features shown on its left side in FIG. 2. For example, the ink entrance manifold 220 and ink exit manifold 222 shown in FIG. 2 on the left side of die stack 200 are mirrored on the right side of the die stack 200, which is not shown in FIG. 2.

Figure 3:
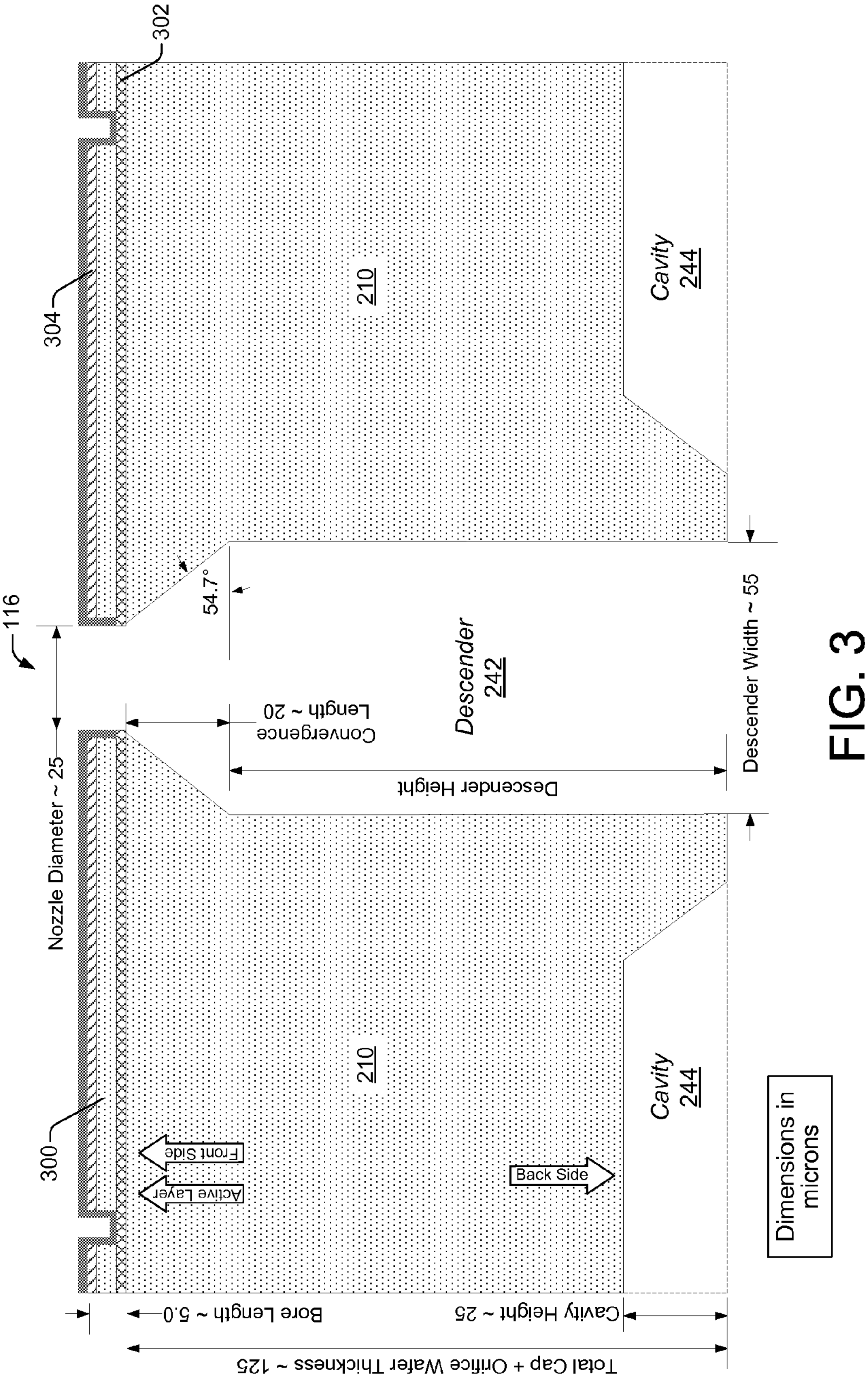
FIG. 3 shows a cross-sectional view of a portion of an integrated orifice plate and cap structure after fabrication, according to an embodiment.

Processing steps appropriate for use in the fabrication of an integrated orifice plate and cap structure 210 will now be described with primary reference to FIGS. 3-18. FIG. 3 shows a cross-sectional view of a portion of an integrated orifice plate and cap structure 210 after fabrication, according to an embodiment of the disclosure. The integrated structure 210 is based on a silicon on insulator (SOI) wafer commonly used in the integrated circuit industry and well-known to those skilled in the art. In general, the SOI wafer has a front side and a back side. At the front side of the SOI wafer is the active layer 300, shown in FIG. 3 to be approximately 5 microns thick. All dimensions shown in FIG. 3 are in microns unless otherwise indicated. However, the dimensions shown are merely examples and are not intended to be limiting in any respect. In addition, the dimensions are not to scale. While example dimensions are provided in FIG. 3, most of the features shown have a range of dimensions that may be suitable for implementation in the integrated structure 210. For example, while the initial SOI wafer material is shown to include an active layer 300 thickness of around 5 microns, the active layer 300 thickness may generally be on the order of 4-40 microns. An active layer 300 thickness of around 5 microns happens to provide a well controlled exit bore length and bore diameter.

The BOX (buried oxide) layer 302 and TOX (thermal oxide) layer 304 are typically on the order of 0.5-2.0 microns in thickness.

Figure 4:
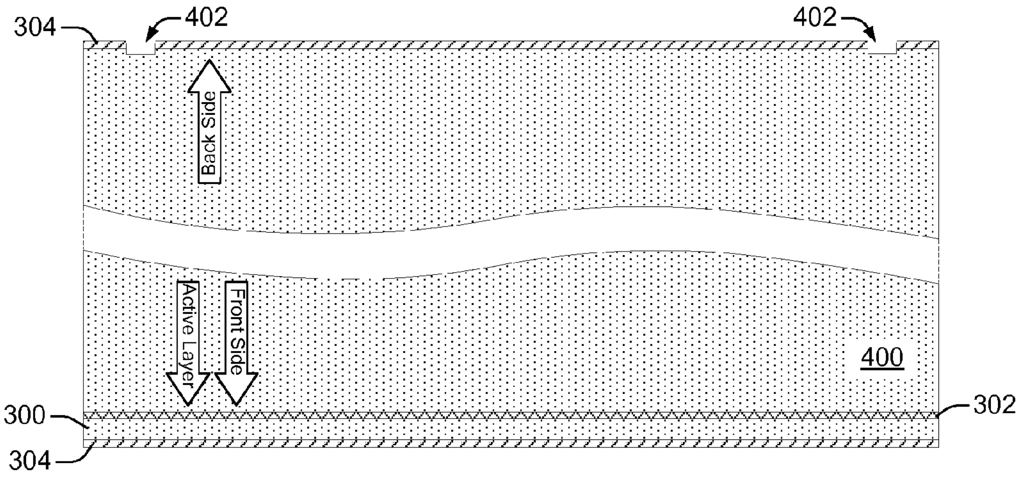
FIG. 4 shows a cross-sectional view of a portion of an SOI wafer after an initial processing step in the fabrication of an integrated orifice plate and cap structure, according to an embodiment.

FIG. 4 shows a cross-sectional view of a portion of an SOI wafer 400, referred to herein as the product wafer 400, after an initial processing step in the fabrication of an integrated orifice plate and cap structure 210, according to an embodiment of the disclosure. The processing step illustrated in FIG. 4 is the forming of an alignment target 402 on the back side of the product wafer 400. Alignment targets enable the proper alignment during subsequent processing steps between features fabricated on both the back and front sides of the wafer 400. The alignment target comprises two or more alignment features 402 formed in the back side of product wafer 400. The alignment features 402 can be in the form of cross-hair targets, chevron patterns, boxes, or circular targets, as dictated by the needs of the photolithography tools. The alignment features 402 are formed using a typical photolithographic process that includes, for example, spin coating photoresist on the back side surface of the wafer 400, imaging the photoresist with an alignment target mask, etching through the TOX layer 304 and into the back side silicon of wafer 400 in the feature areas where the photoresist has been removed with the photo imaging, and then removing the remaining photoresist using an ash process. The etch is typically a dry plasma etch, but it can also be a wet etch. The depth of the etch into back side silicon of wafer 400 depends in part on the types of tools used in the photolithography process. The individual steps of the photolithographic process are well-known to those skilled in the art, and are therefore not shown in FIG. 4. Furthermore, this general photolithographic process is repeated a number of times during the fabrication of the integrated orifice plate and cap structure 210.

Figure 5:
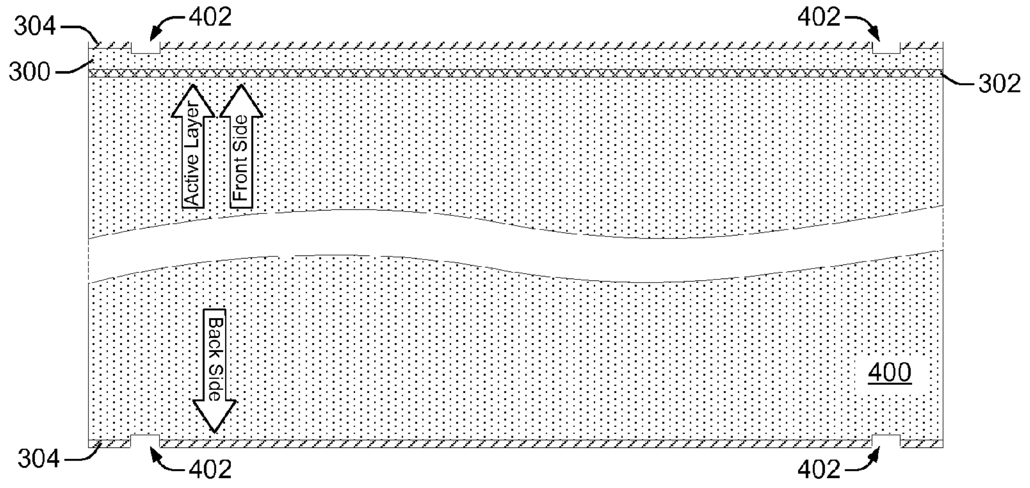
FIG. 5 shows the result of a front side alignment target forming process step, according to an embodiment.

FIG. 5 shows the result of a front side alignment target forming process step, according to an embodiment of the disclosure. In this step, the product wafer 400 is first inverted such that the front (active layer 300, or scribe) side, is up. The front side of the wafer 400 is then processed in the same type of photolithographic process applied to the back side. Photoresist is spin-coated on the front side and then imaged using an alignment target mask to open up target areas in the photoresist. A dry plasma etch is then typically applied to etch away the TOX and some depth of the silicon within the target areas 402. The remaining photoresist is then stripped off using an ash process.

Figure 6:
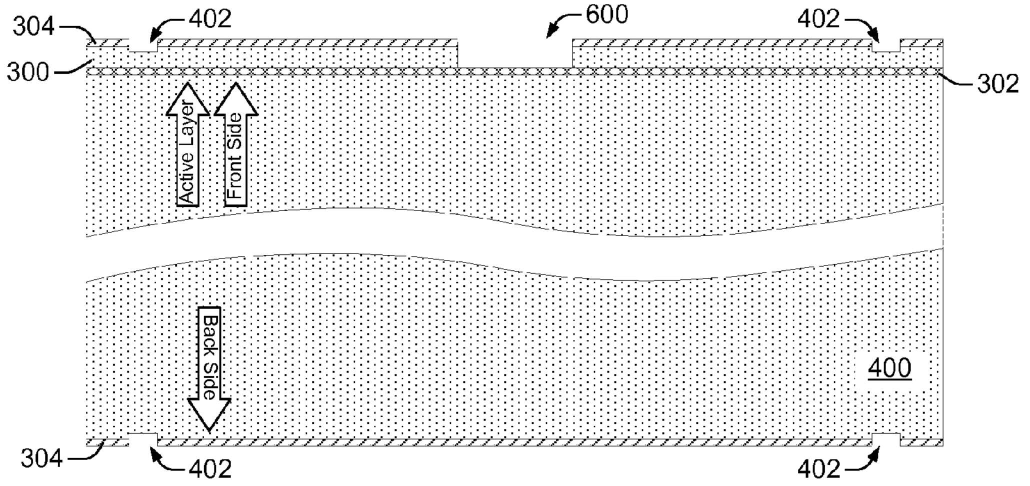
FIG. 6 shows the result of an orifice/nozzle bore forming process step, according to an embodiment.

FIG. 6 shows the result of an orifice/nozzle bore forming process step, according to an embodiment of the disclosure. Photoresist is again spun onto the front (active layer 300) side of the product wafer 400 and then imaged with a bore mask to create a bore opening 600 in the photoresist. A deep reactive ion etch (DRIE oxide etch) is then performed, etching through the TOX layer 304 and then the silicon (Bosch Si etch) active layer 300 about 5 microns deep and stopping at the BOX layer 302, which provides a natural etch stop. The DRIE etch provides a well-controlled bore diameter and straight bore walls, which are desirable for producing proper drop weight, drop velocity and drop trajectory during inkjet operation. The remaining photoresist is then removed using an ash process.

Figure 7:
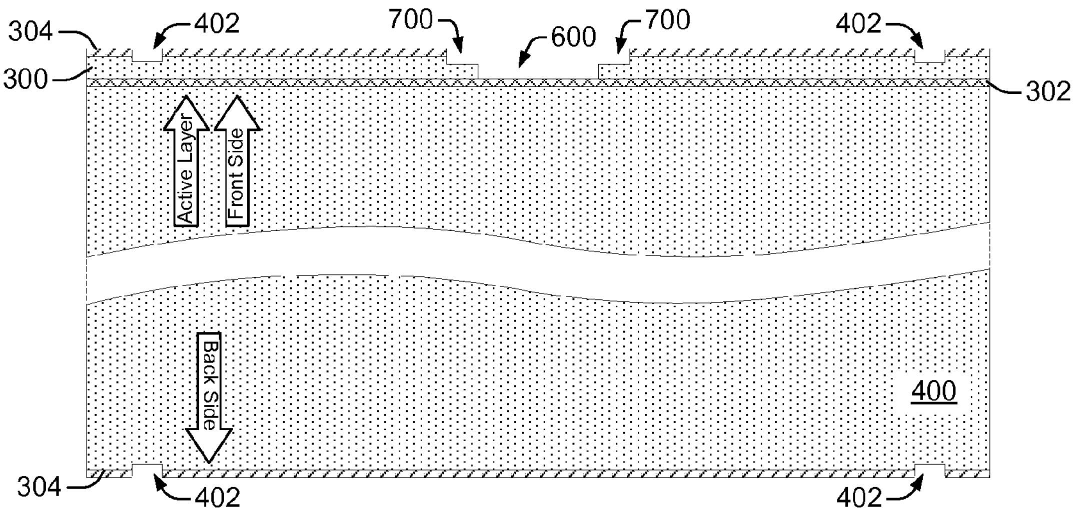
FIG. 7 shows an alternate implementation that includes a counter-bore geometry that can be introduced with an additional photolithographic mask process, according to an embodiment.

FIG. 7 shows an alternate embodiment that includes a counter-bore geometry 700 that can be introduced with an additional photolithographic mask process. In this embodiment, the resulting integrated orifice plate and cap structure 210 includes a recessed region 700 outside of the bore and surrounding the bore that helps prevent wipers or other physical structures from contacting the bore opening. This design also reduces ink puddling at the top surface of the integrated structure 210 (wafer 400) thereby improving drop weight, velocity and trajectory.

Figure 8:
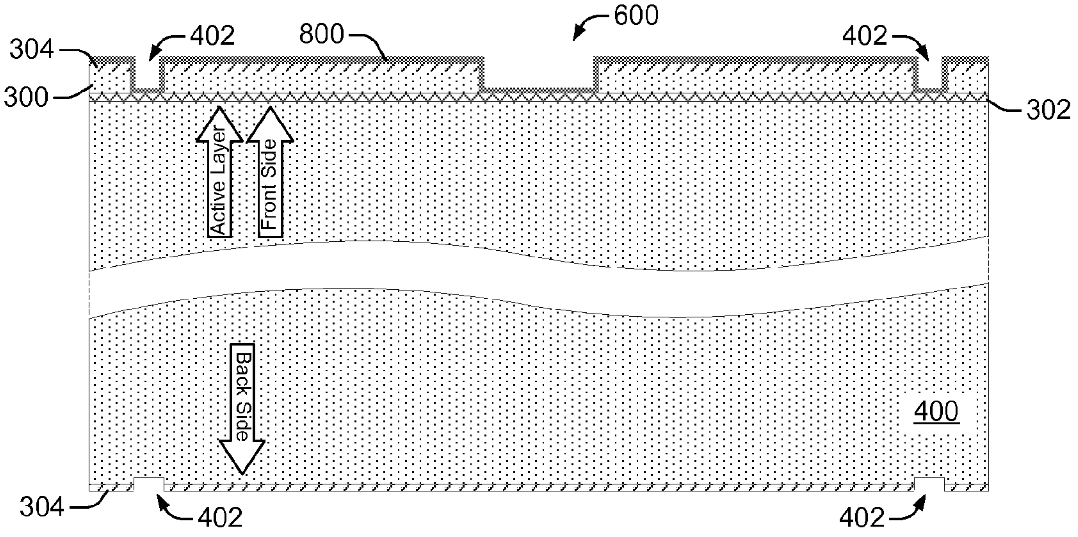
FIG. 8 shows the result of an orifice bore wall and face protective coating process step, according to an embodiment.

FIG. 8 shows the result of an orifice bore wall and face protective coating process step, according to an embodiment of the disclosure. The processing result shown in FIG. 8 is continued from the orifice/nozzle bore forming step shown in FIG. 6 (i.e., without the counter-bore geometry shown in FIG. 7). In this step, a protective coating 800 can be deposited in a PECVD (plasma-enhanced chemical vapor deposition) process to coat the bore side walls with a material that provides mechanical and chemical protection to the silicon of active layer 300. In one embodiment, a 0.5 micron thick protective coating 800 of silicon carbide is deposited. However, various other materials are possible for use as the protective coating 800 using the PECVD process, such as silicon oxide. In addition, using a sputter deposition process allows various metals, such as tantalum, to be deposited as the protective coating 800 for the bore side walls.

In an alternate embodiment, an LSE (low-surface energy) coating may be applied over the top of the protective coating shown in FIG. 8. This LSE coating would typically cover the top face of the orifice structure, and may partially extend down the side walls of the orifice bores. An LSE coating provides a non-wetting surface over the protective coating. Applying an LSE coating may include additional photolithography process steps in order to pattern the coating and prevent it from entering too far into the interior surfaces of the bore.

Figure 9:
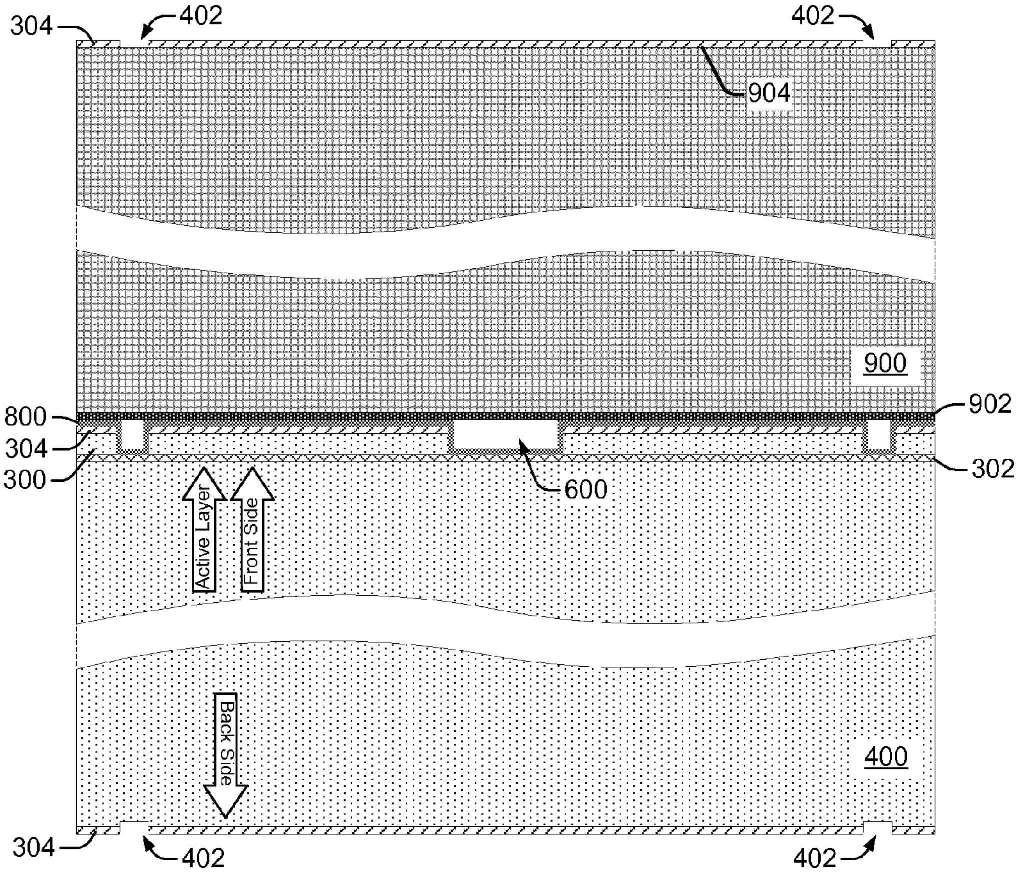
FIG. 9 shows the result of a handle wafer attachment step and a back side handle wafer alignment target forming process step, according to an embodiment.

FIG. 9 shows the result of a handle wafer attachment step and a back side handle wafer alignment target forming process step, according to an embodiment of the disclosure. In this step, the product wafer 400 is first inverted such that the front (active layer 300) side, is up. A handle wafer 900 is then attached to the front side of the product wafer 400 using a temporary wafer bond 902, such as a high temperature (e.g., 200° C.) thermal release tape. In one embodiment, the handle wafer 900 can be a 500 micron thick, double-side polished wafer. Alignment targets 402 are then formed on the handle wafer back side 904. Photoresist is spin-coated on the handle wafer back side 904, and a target mask is used to photo image the handle wafer targets so they align with the product wafer 400 back side targets defined previously. The TOX layer and possibly some of the silicon on the handle wafer back side 904 are then etched. The remaining photoresist is then stripped in an ash process.

Figure 10:
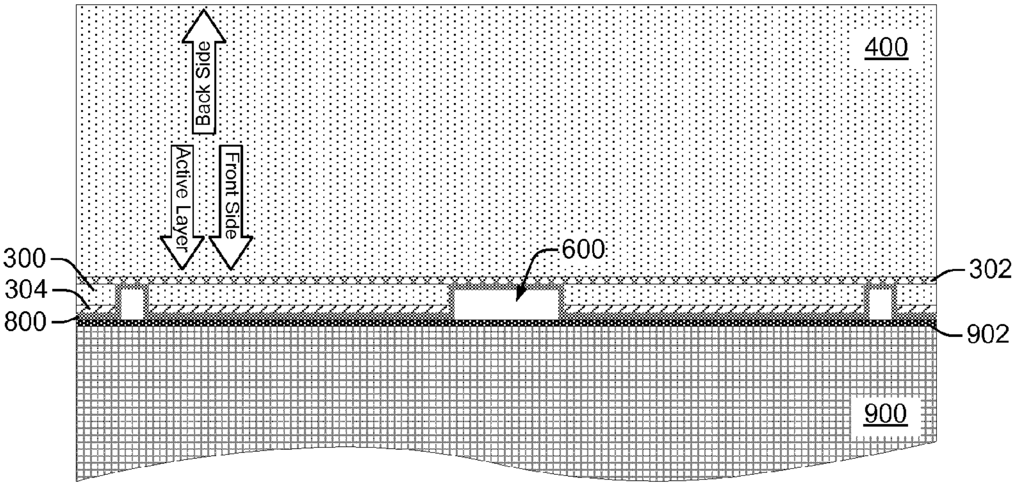
FIG. 10 shows the result of a wafer grinding process step to grind the product wafer to a final thickness, according to an embodiment.

FIG. 10 shows the result of a wafer grinding process step to grind the product wafer 400 to a final thickness, according to an embodiment of the disclosure. In this step, the wafer is flipped such that the back side is up and available for processing. The back side of the product wafer 400 is ground to a thickness on the order of 100 to 200 microns. In one embodiment, the grinding step includes a coarse grind, an edge grind (e.g., 1 mm), and then a poligrind, which leaves the ground surface finish in a condition suitable for subsequent photolithography/etching operations.

Figure 11:
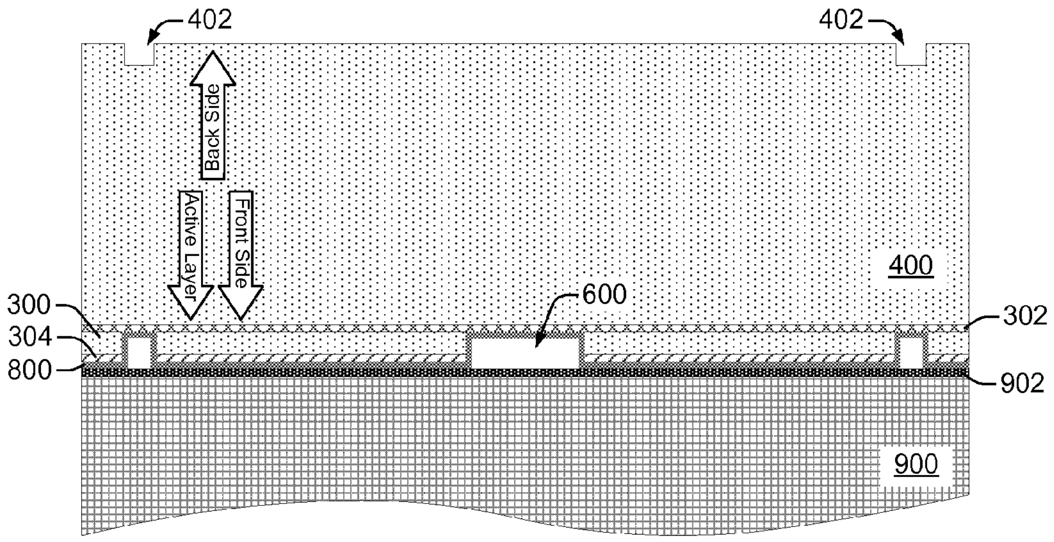
FIG. 11 shows the result of a back side alignment target forming process step, according to an embodiment.

FIG. 11 shows the result of a back side alignment target forming process step, according to an embodiment of the disclosure. In this step, alignment targets 402 are formed to replace the previous alignment targets removed in the prior wafer grinding step. The ground back side of the wafer 400 is processed in the same type of photolithographic process applied to earlier alignment target fabrications. Photoresist is spin-coated on the front side and then imaged using an alignment target mask to open up target areas in the photoresist. A dry plasma etch is then typically applied to etch away the silicon within the target areas 402. The remaining photoresist is then stripped off using an ash process.

Figure 12:
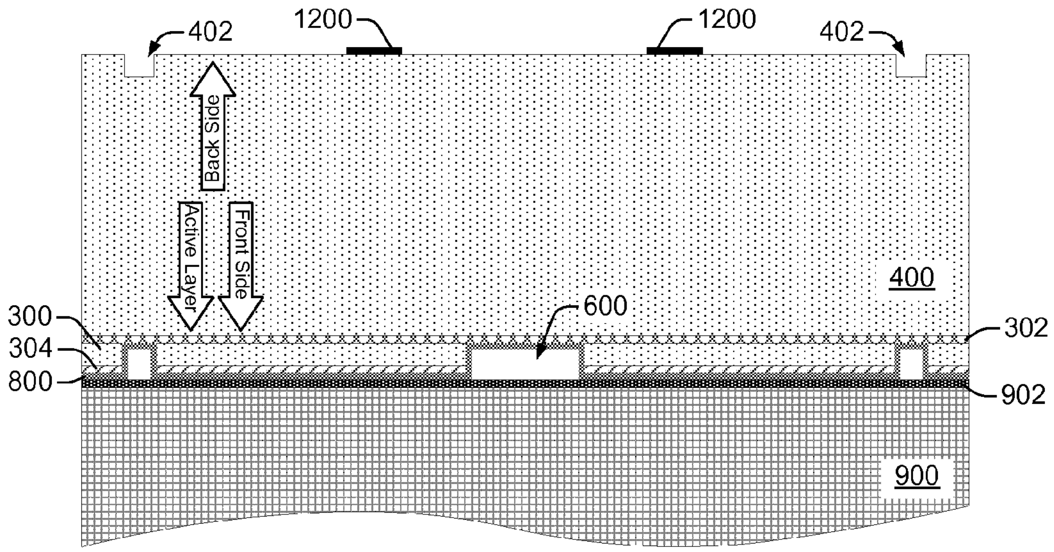
FIG. 12 shows the result of a cavity hardmask deposition processing step, according to an embodiment.

FIG. 12 shows the result of a cavity hardmask deposition processing step, according to an embodiment of the disclosure. In this step a low temperature USG (undoped silicate glass) oxide hardmask material is deposited in a PECVD process, and then further processed into a cavity hardmask 1200 for subsequent use as a TMAH etch mask for delineation of cavities 244 (see FIG. 2). Other suitable hardmask materials may be used as an alternative to the USG. The further processing includes a photoresist and etch operation performed to leave the USG oxide in appropriate places as the cavity hardmask 1200 for the subsequent TMAH etch. Thus, photoresist is spin-coated on the on the back side of the product wafer 400 and a cavity mask is used to photo image the photoresist. The USG oxide is then etched, stopping at the silicon of the wafer 400, and the remaining photoresist is removed in an ash process.

Figure 13:
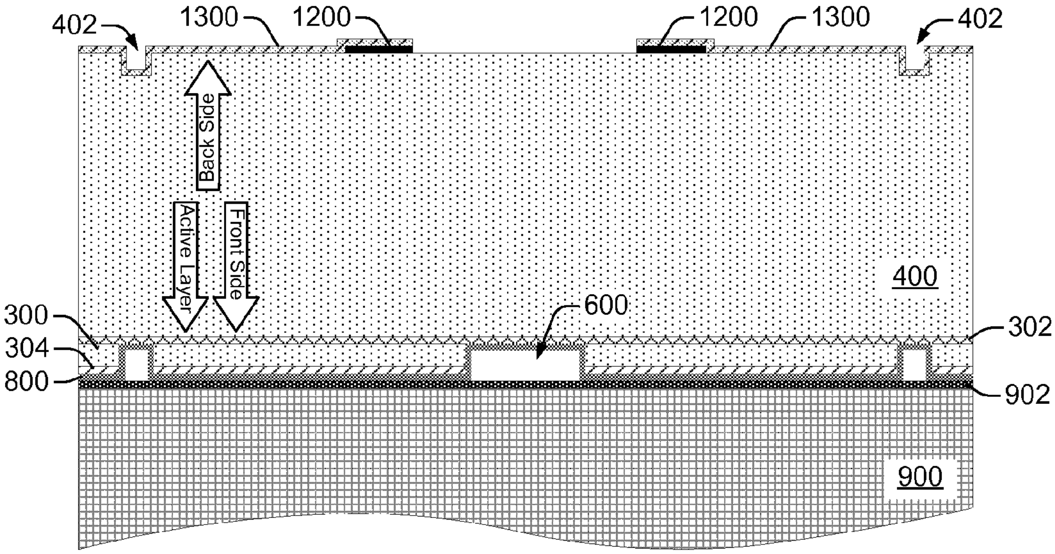
FIG. 13 shows the result of a descender hardmask deposition processing step, according to an embodiment.

FIG. 13 shows the result of a descender hardmask deposition processing step, according to an embodiment of the disclosure. In this step a metal coating such as an aluminum alloy is deposited in a sputter process, and then further processed into a descender hardmask 1300 for subsequent use as a DRIE/Bosch etch mask for delineation of descender 242 (see FIGS. 2 and 3). In one implementation, a metal layer of 0.02 microns of Ti (to improve adhesion of descender hardmask 1300 to substrate 400) and 0.9 microns of Al—Cu alloy is sputter deposited. The further processing includes a photoresist and etch operation performed to leave metal in appropriate places as the descender hardmask 1300 for the subsequent DRIE/Bosch etch. Thus, photoresist is spin-coated on the on the back side of the product wafer 400 and a descender mask is used to photo image the photoresist. The metal hardmask films are then dry etched, stopping at the silicon of the wafer 400, and the remaining photoresist is removed in an ash process.

Figure 14:
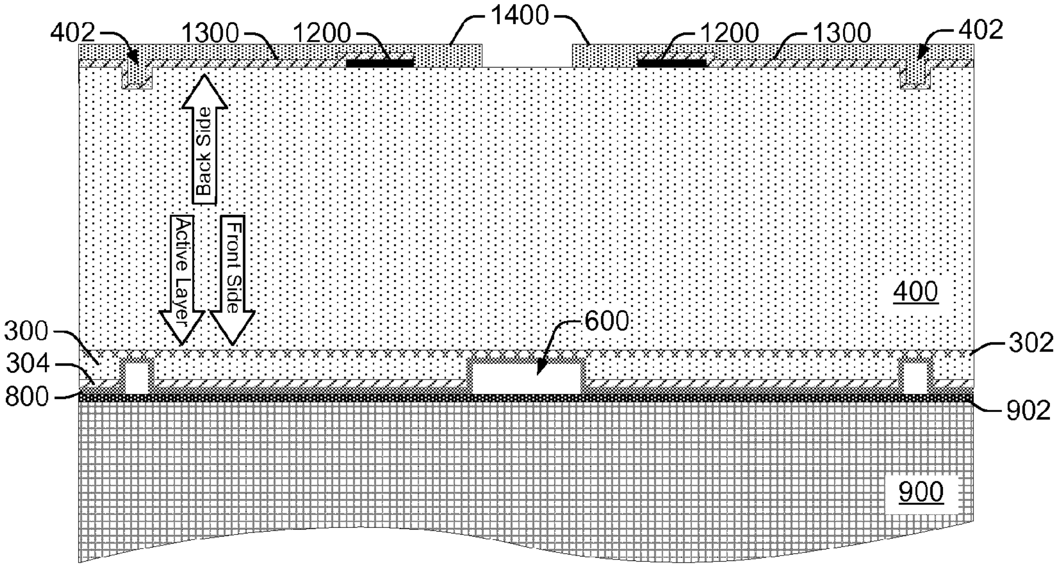
FIG. 14 shows the result of a convergent bore softmask photo processing step, according to an embodiment.

FIG. 14 shows the result of a convergent bore softmask photo processing step, according to an embodiment of the disclosure. In this step, photoresist 1400 is spin-coated on the back side of the product wafer 400, and the previously deposited cavity and descender hardmasks (1200, 1300). A convergent bore mask is then photo imaged to remove some of the photoresist 1400, delineating a silicon area of the product wafer 400 that will be subsequently dry etched to form a latent convergent bore feature 1500 as shown in FIG. 15.

Figure 15:
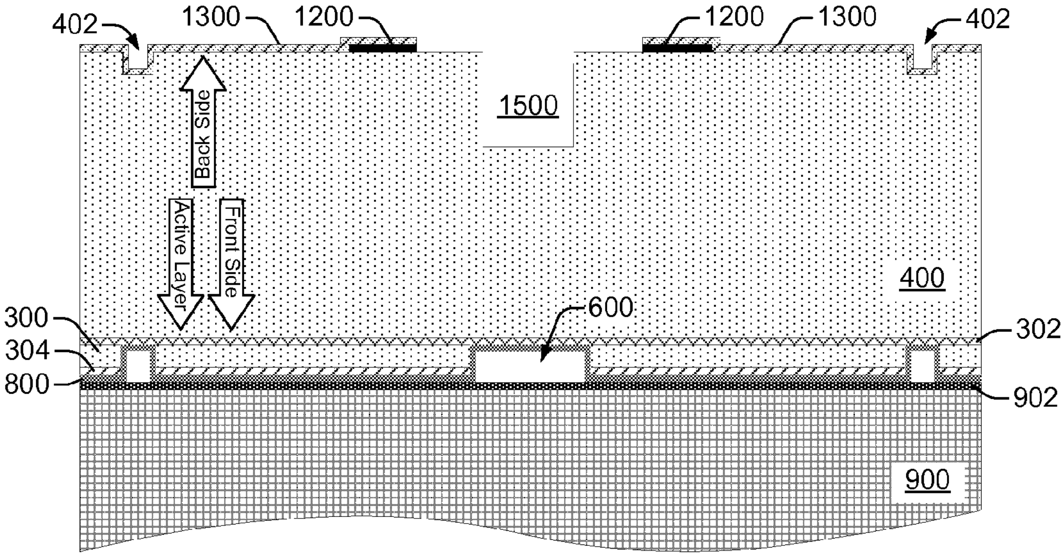
FIG. 15 shows the result of a latent convergent bore feature dry etch process, according to an embodiment.

FIG. 15 shows the result of a latent convergent bore feature 1500 dry etch process, according to an embodiment of the disclosure. In this step a DRIE/Bosch dry etch is used to etch the silicon of product wafer 400 in the area delineated by the photoresist. In one implementation, the latent convergent bore feature 1500 is etched about 20 microns deep into the silicon. The etching is following by a strip of the remaining photoresist with an ash process. The stripping of the photoresist exposes the edges of the silicon next to the latent convergent bore feature 1500 that are not masked by the cavity hardmask 1200 or the descender hardmask 1300.

Figure 16:
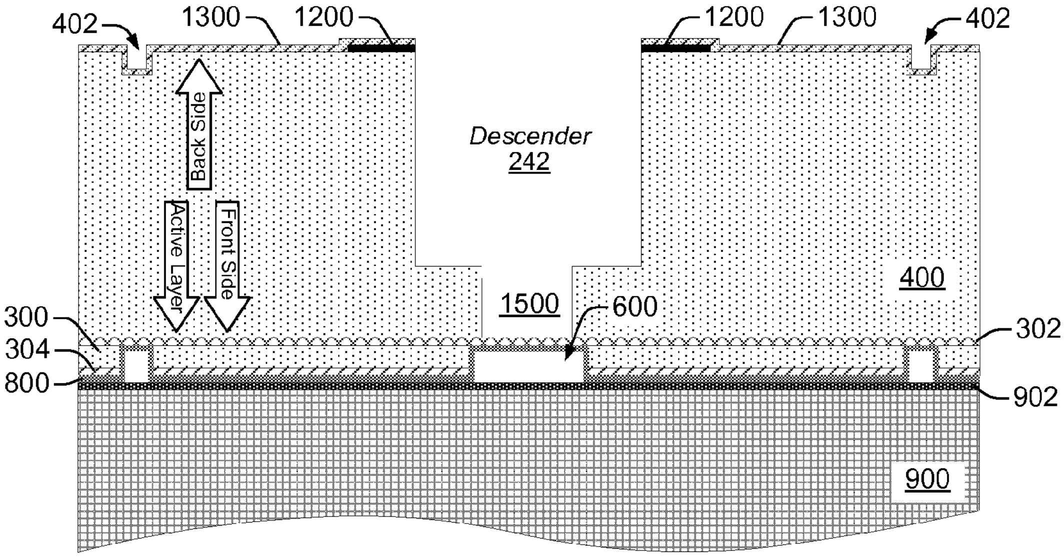
FIG. 16 shows the result of a descender dry etch process, according to an embodiment.

FIG. 16 shows the result of a descender dry etch process, according to an embodiment of the disclosure. In this step a DRIE/Bosch etch is used to etch the silicon of product wafer 400 in the area delineated by the descender hardmask 1300 previously formed in the process step discussed above with respect to FIG. 13. The area etched in this process becomes the descender 242 (see FIGS. 2 and 3). In one implementation, the descender is etched approximately 110 microns into the silicon of wafer 400. As the descender 242 is etched in the DRIE etch process, the latent convergent bore feature 1500 is also etched and advances further through the silicon of product wafer 400, stopping at the BOX layer 302. The remaining descender hardmask 1300 material is then stripped off in another chemical etch process.

Figure 17A:
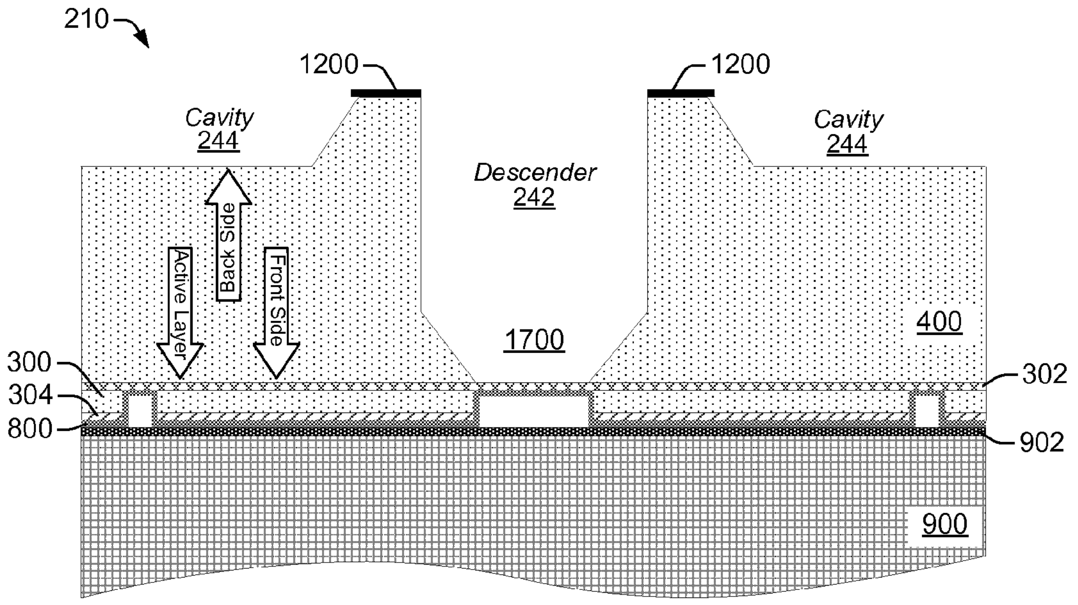
FIGS. 17*a*-17*c* show the result of a wet anisotropic silicon etch to form a convergent bore section in the descender and cavities, according to embodiments.
Figure 17B:
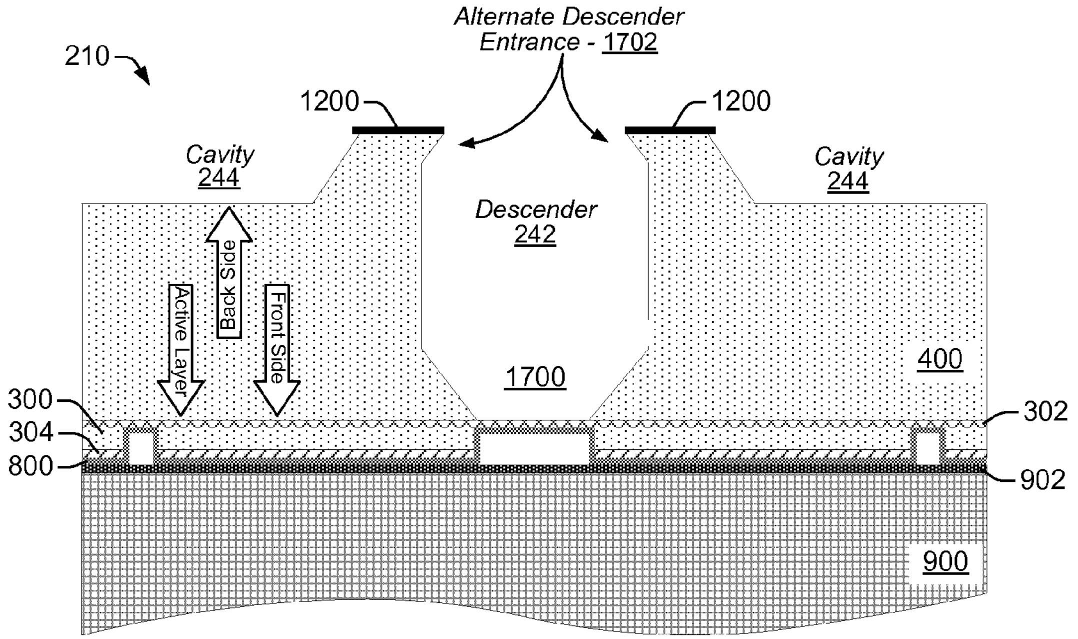
Figure 17C:
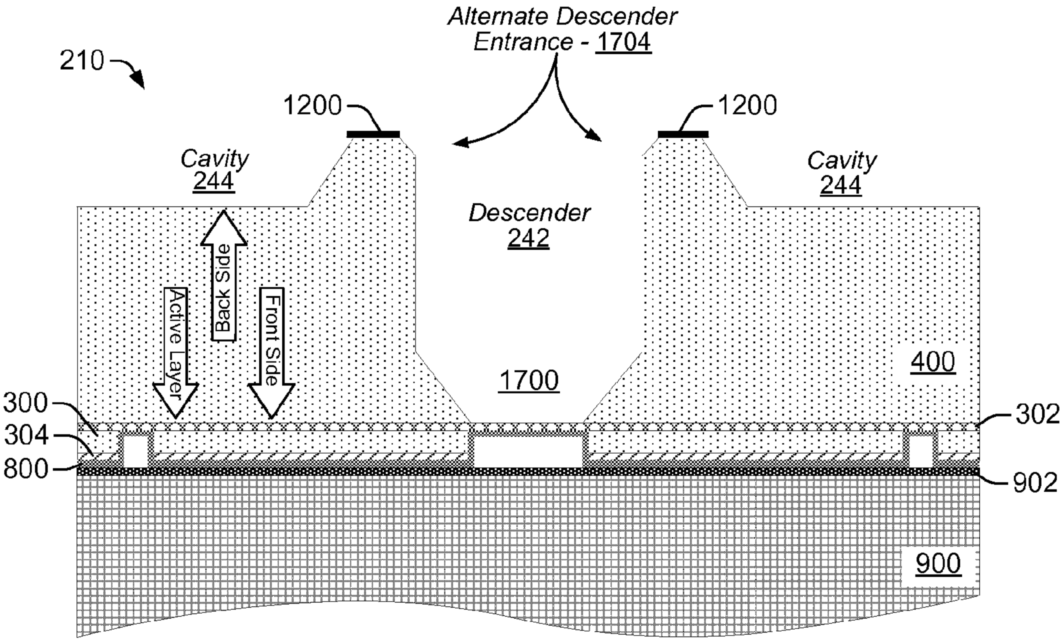

FIGS. **17*a*-17*c* show the result of a wet anisotropic silicon etch to form the convergent bore feature 1700 and concurrently, the cavities 244, according to an embodiment of the disclosure. In this step, an anisotropic Si wet etch is used to etch the silicon of product wafer 400 in the area delineated by the cavity hardmask 1200 previously formed in the process step discussed above with respect to FIG. 12. Suitable anisotropic wet Si etches include TMAH, KOH, NaOH and EDP. The wet anisotropic Si etchants produce a characteristic 54.7 degree angle due to slow etching of the <111> crystal plane of the silicon relative to silicon planes <100> and <110> of the silicon. Accordingly, the side walls of cavities 244 and the convergent bore 1700 are angled at approximately 54.7 degrees. This is a beneficial fluidic feature in the operation of the printhead 114. The formation of cavities 244 in the anisotropic Si etch step of FIG. 17 completes the fabrication of the integrated orifice plate and cap structure 210 (see FIGS. 2 and 3). The edges of descender hardmask 1300 and cavity hardmask 1200 (FIG. 16) can be located with respect to the TMAH etch time to fabricate a vertical, sloping and reentrant entrance of the descender 242. FIG. 17*b* shows an alternate descender entrance 1702 that may be formed when the cavity hardmask 1200 and descender hardmask 1300 are originally aligned. FIG. 17*c* shows an alternate descender entrance 1704 that may be formed when the cavity hardmask 1200 is pulled back or shortened relative to the descender hardmask 1300**.

Figure 18:
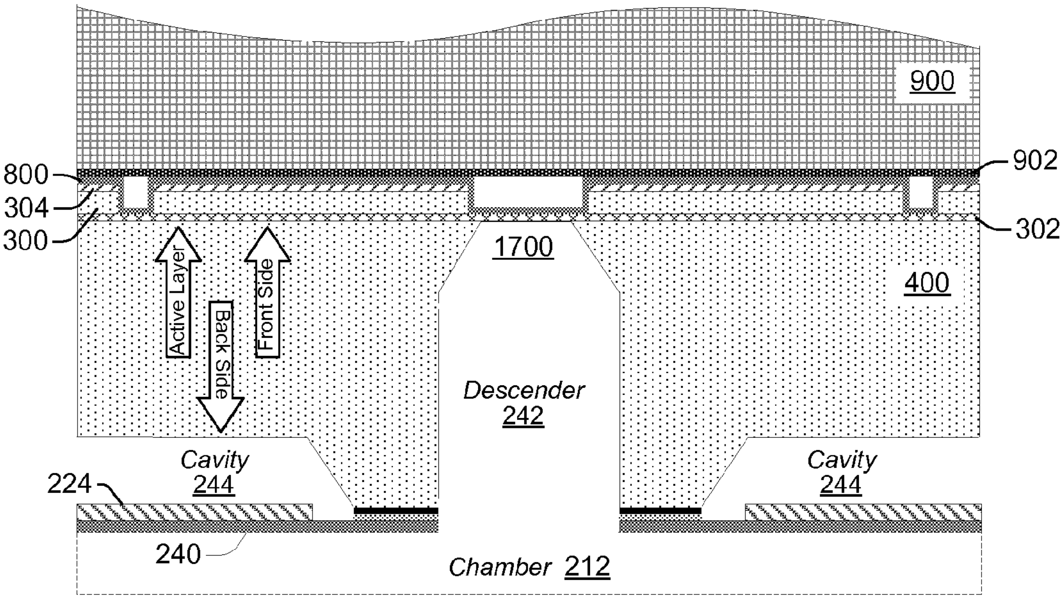
FIG. 18 shows an integrated orifice plate and cap structure adhered to a actuator/chamber die layer in a die stack of a printhead, according to an embodiment.

FIG. 18 shows the integrated orifice plate and cap structure 210 adhered to the actuator/chamber die 206 layer in the die stack 200 of printhead 114, as shown in FIG. 2, according to an embodiment of the disclosure. Although not illustrated in FIG. 18, the BOX layer 302 and protective coating 800 films in the interior of the straight bore section of the nozzles 116 are selectively removed in another appropriate chemical etch step prior to completion of the printhead 114 fabrication.

In another process flow, two masking steps are employed and the silicon dry etch 1500 extends the depth of substrate 400. A TMAH wet etch forms descender 242. This process reduces the number of process steps. However, in this process the TMAH time defines the final cavity 244 depth and the descender width 242.

Figure 19:
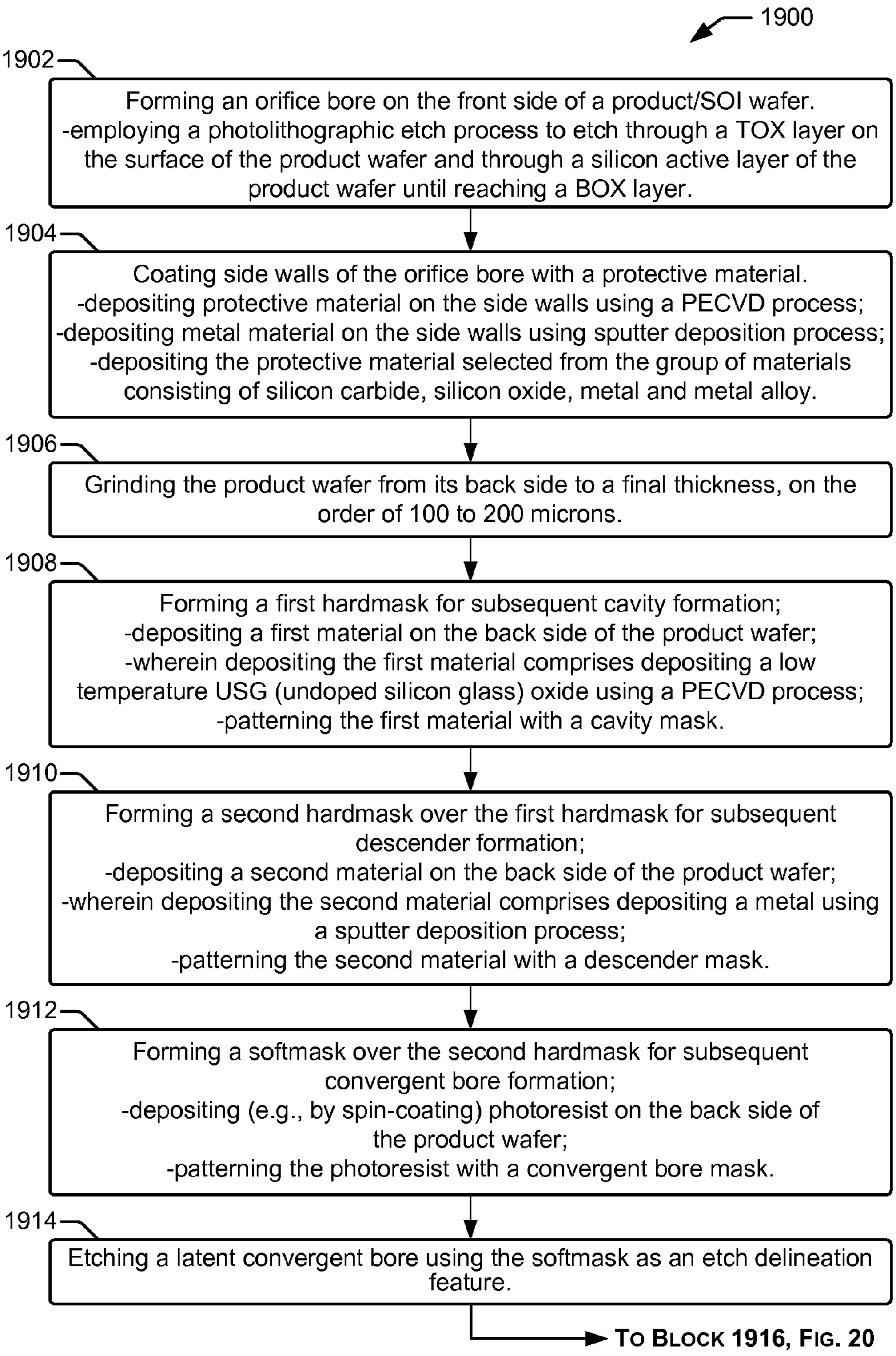
FIGS. 19 and 20 show a flowchart of example methods of fabricating an integrated orifice plate and cap structure, according to embodiments.

FIG. 19 shows a flowchart of example methods 1900 of fabricating an integrated orifice plate and cap structure 210, according to embodiments of the disclosure. Methods 1900 are associated with the embodiments discussed herein with respect to FIGS. 1-18 and generally correspond with the process fabrication steps described above with respect to FIGS. 3-18.

Method 1900 begins at block 1902 with forming an orifice bore on the front side of a product/SOI wafer. Forming the orifice bore can be achieve by employing a photolithographic etch process to etch through a TOX layer on the surface of the product wafer and through a silicon active layer of the product wafer until reaching a BOX layer. At block 1904, the method continues with coating side walls of the orifice bore with a protective material. Coating the side walls can include, for example, depositing protective material on the side walls using a PECVD process or depositing metal material on the side walls using a sputter deposition process. The protective material deposited on the side walls can be, for example, silicon carbide, silicon oxide, metal or metal alloy.

The method continues at block 1906 with grinding the product wafer from its back side to a final thickness. The final thickness is typically on the order of 100 to 200 microns. At block 1908, a first hardmask is formed. The first hardmask is formed to enable a subsequent etching step to form cavities 244. The first hardmask is formed by depositing a first material on the back side of the product wafer. An appropriate material for the first hardmask is a low temperature USG (undoped silicon glass) oxide deposited using a PECVD process. After the material for the first hardmask is deposited, it is patterned with a cavity mask.

At block 1910 of method 1900, a second hardmask is formed over the first hardmask. The second hardmask is formed to enable a subsequent etching step to form descender 242. The second hardmask is formed by depositing a second material on the back side of the product wafer. An appropriate material for the second hardmask is a metal deposited using a sputter deposition process. After the material for the second hardmask is deposited, it is patterned with a descender mask. As shown at block 1912, the method includes forming a softmask over the second hardmask. The softmask is formed to enable a subsequent etching step to form a convergent bore 1700. The softmask is formed by depositing (e.g., by spin-coating) photoresist on the back side of the product wafer and patterning the photoresist with a convergent bore mask.

Figure 20:
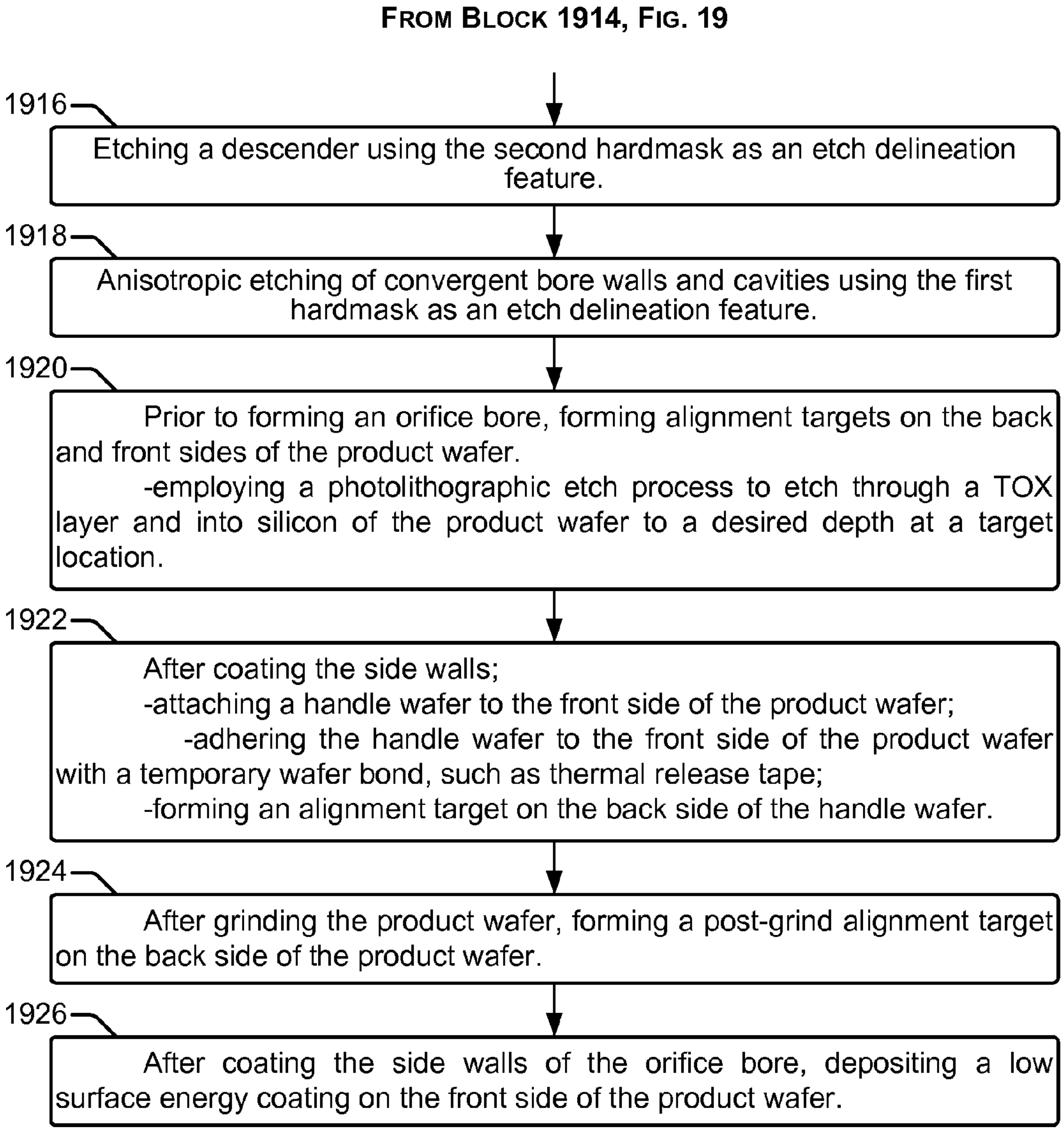

At block 1914 of method 1900, a latent convergent bore is etched using the softmask to delineate the desired etching zone. The method 1900 continues on FIG. 20 with block 1916, where the descender 242 is etched using the second hardmask to delineate the desired etching zone. At block 1918, the convergent bore features 1700 and the cavities 244 are then anisotropically etched using the first hardmask to delineate the desired etching zone.

The method includes additional steps as shown at blocks 1920 through 1926. At block 1920, prior to forming an orifice bore (at block 1902), alignment targets are formed on the back and front sides of the product wafer. Alignment targets are formed using a photolithographic etch process to etch through a TOX layer and into silicon of the product wafer to a desired depth at target locations. At block 1922, after coating the side walls (at block 1904), the method 1900 includes attaching a handle wafer to the front side of the product wafer. The handle wafer is attached by adhering it to the front side of the product wafer with a temporary wafer bond, such as thermal release tape. The step additionally includes forming an alignment target on the back side of the handle wafer. At block 1924, after grinding the product wafer (at block 1906), the method 1900 includes forming a post-grind alignment target on the back side of the product wafer. At block 1926, the method 1900 can also include, after coating the side walls of the orifice bore (at block 1904), depositing a low surface energy coating on the front side of the product wafer.

What is claimed is:

1. A method comprising:

fabricating an integrated orifice plate and cap structure having an orifice bore, a convergent bore adjacent the orifice bore, a cavity to protect an actuator, and a descender to receive a fluid and discharge the fluid through the convergent bore to the orifice bore, the fabricating comprising:

forming the orifice bore on the front side of a product wafer;

coating side walls of the orifice bore with a protective material;

grinding the product wafer from its back side to a final thickness;

forming a first hardmask for subsequent cavity formation and subsequent convergent bore formation;

forming a second hardmask over the first hardmask for subsequent descender formation;

forming a softmask over the second hardmask for the subsequent convergent bore formation;

etching a latent convergent bore using the softmask as an etch delineation feature;

etching the descender using the second hardmask as an etch delineation feature; and anisotropic etching the convergent bore and the cavity using the first hardmask as an etch delineation feature.

2. A method as in claim 1, wherein forming the first hardmask comprises:

depositing a first material on the back side of the product wafer; and patterning the first material with a cavity mask, wherein the cavity is to protect the actuator from fluid, and wherein the anisotropic etching forms the cavity distinct from the convergent bore.

3. A method as in claim 2, wherein depositing the first material comprises depositing a low temperature USG (undoped silicon glass) oxide using a PECVD process.

4. A method as in claim 1, wherein forming the second hardmask comprises:

depositing a second material on the back side of the product wafer; and patterning the second material with a descender mask, wherein the descender extends from the convergent bore and comprises a channel to receive the fluid and discharge the fluid to the convergent bore.

5. A method as in claim 4, wherein depositing the second material comprises depositing a metal using a sputter deposition process.

6. A method as in claim 1, wherein forming the softmask comprises:

depositing photoresist on the back side of the product wafer; and patterning the photoresist with a convergent bore mask.

7. A method as in claim 6, wherein depositing the photoresist comprises spin-coating the photoresist on the back side of the product wafer.

8. A method as in claim 1, wherein grinding the product wafer comprises grinding the product wafer to a final thickness on the order of 100 to 200 microns.

9. A method as in claim 1, wherein forming the orifice bore comprises employing a photolithographic etch process to etch through a TOX layer on the surface of the product wafer and through a silicon active layer of the product wafer until reaching a BOX layer.

10. A method as in claim 1, wherein coating the side walls comprises depositing the protective material on the side walls using a PECVD process.

11. A method as in claim 1, wherein coating the side walls comprises depositing a metal material on the side walls using a sputter deposition process.

12. A method as in claim 1, wherein coating the side walls comprises depositing the protective material selected from the group of materials consisting of silicon carbide, silicon oxide, metal and metal alloys.

13. A method as in claim 1, further comprising:

prior to forming an orifice bore, forming alignment targets on the back and front sides of the product wafer.

14. A method as in claim 13, wherein forming an alignment target comprises employing a photolithographic etch process to etch through a TOX layer and into silicon of the product wafer to a desired depth at a target location.

15. A method as in claim 1, further comprising:

after coating the side walls, attaching a handle wafer to the front side of the product wafer; and forming an alignment target on the back side of the handle wafer.

16. A method as in claim 15, wherein attaching a handle wafer comprises adhering the handle wafer to the front side of the product wafer with a temporary wafer bond.

17. A method as in claim 16, wherein the temporary wafer bond comprises a thermal release tape.

18. A method as in claim 1, further comprising:

after grinding the product wafer, forming a post-grind alignment target on the back side of the product wafer.

19. A method as in claim 1, further comprising:

after coating the side walls of the orifice bore, depositing a low surface energy coating on the front side of the product wafer.

20. A method as in claim 1, wherein the product wafer is a SOI (silicon on insulator) wafer.

* * * * *